United States Patent
Funayama et al.

(10) Patent No.: US 11,791,820 B2
(45) Date of Patent: Oct. 17, 2023

(54) OUTPUT CIRCUIT, TRANSMISSION CIRCUIT, AND SEMICONDUCTOR INTEGRATED CIRCUIT

(71) Applicant: Socionext Inc., Kanagawa (JP)

(72) Inventors: Takumi Funayama, Kanagawa (JP); Akiyoshi Matsuda, Kanagawa (JP)

(73) Assignee: SOCIONEXT INC., Yokohama (JP)

( * ) Notice: Subject to any disclaimer, the term of this patent is extended or adjusted under 35 U.S.C. 154(b) by 0 days.

(21) Appl. No.: 17/895,763

(22) Filed: Aug. 25, 2022

(65) Prior Publication Data

US 2022/0407519 A1 Dec. 22, 2022

Related U.S. Application Data

(63) Continuation of application No. PCT/JP2020/008029, filed on Feb. 27, 2020.

(51) Int. Cl.
*H03K 19/0175* (2006.01)
*H03K 17/687* (2006.01)

(52) U.S. Cl.
CPC . *H03K 19/017509* (2013.01); *H03K 17/6872* (2013.01)

(58) Field of Classification Search
CPC ..... H03K 19/017509; H03K 19/00315; H03K 17/6872
See application file for complete search history.

(56) References Cited

U.S. PATENT DOCUMENTS 6,307,408 B1 * 10/2001 Shamlou ............... H04L 25/028
327/112
7,741,874 B2 * 6/2010 Nedalgi ........... H03K 19/00315
327/333

(Continued)

FOREIGN PATENT DOCUMENTS

JP  2003-504860 A  2/2003
JP  2011-004313 A  1/2011

(Continued)

OTHER PUBLICATIONS

International Search Report (ISR) dated Apr. 21, 2020 issued in International Patent Application No. PCT/JP2020/008029, with English translation.

*Primary Examiner* — Ryan Johnson
*Assistant Examiner* — Colleen J O Toole
(74) *Attorney, Agent, or Firm* — McDermott Will & Emery LLP

(57) ABSTRACT

An output circuit includes: a first input transistor that is provided between a first power supply line and a first intermediate node; a second input transistor that is provided between a second intermediate node and a second power supply line; a first cascode transistor that is provided between the first intermediate node and an output node, and receives a first clip voltage from a first voltage generation circuit; a second cascode transistor that is provided between the output node and the second intermediate node, and receives a second clip voltage from a second voltage generation circuit; a first switch transistor that is provided between the first intermediate node and a gate of the first cascode transistor, and turns on during power down; and a second switch transistor that is provided between the second intermediate node and a gate of the second cascode transistor, and turns on during power down.

20 Claims, 5 Drawing Sheets

(56) References Cited

U.S. PATENT DOCUMENTS

| | | | |
|---|---|---|---|
| 9,496,874 B2 * | 11/2016 | Kim | ............... H03K 19/018521 |
| 2012/0223780 A1 | 9/2012 | Urakawa | |
| 2014/0062595 A1 | 3/2014 | Mitsuishi et al. | |
| 2014/0292379 A1 | 10/2014 | Itonaga | |
| 2015/0381179 A1 | 12/2015 | Zhang et al. | |

FOREIGN PATENT DOCUMENTS

| | | |
|---|---|---|
| JP | 2012-191275 A | 10/2012 |
| JP | 2014-209715 A | 11/2014 |
| JP | 2015-164248 A | 9/2015 |
| JP | 2016-054542 A | 4/2016 |
| JP | 2016-167748 A | 9/2016 |
| WO | 01/03301 A1 | 1/2001 |

\* cited by examiner

F I G. 6
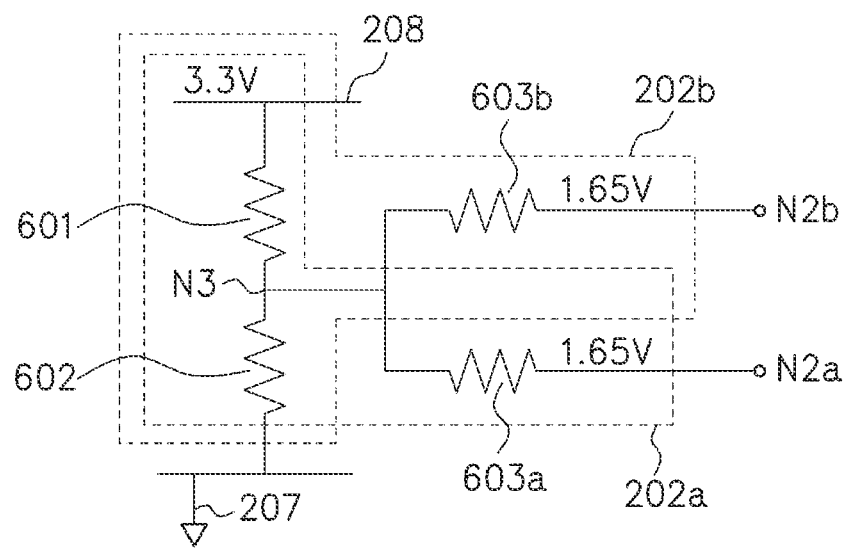

US 11,791,820 B2

OUTPUT CIRCUIT, TRANSMISSION CIRCUIT, AND SEMICONDUCTOR INTEGRATED CIRCUIT

CROSS-REFERENCE TO RELATED APPLICATION

This application is a continuation application of International Application PCT/JP2020/008029 filed on Feb. 27, 2020, and designated the U.S., the entire contents of which are incorporated herein by reference.

FIELD

The embodiments discussed herein are directed to an output circuit, a transmission circuit, and a semiconductor integrated circuit.

BACKGROUND

Patent Document 1 discloses an output circuit including a first PMOS transistor and a second PMOS transistor connected in series between a high potential side power supply and an output node, and a first NMOS transistor and a second NMOS transistor connected in series between a low potential side power supply and the output node. The first PMOS transistor is connected to the high potential side power supply side, and the second PMOS transistor is connected to the output node side. The first NMOS transistor is connected to the low potential side power supply side, and the second NMOS transistor is connected to the output node side.

A first capacitive coupling part includes a first terminal and a second terminal, in which the first terminal is connected to a gate terminal of the first PMOS transistor, and the second terminal is connected to a gate terminal of the second PMOS transistor or a gate terminal of the second NMOS transistor, and the first capacitive coupling part controls capacitive coupling between the first and second terminals based on a potential at the gate terminal of the first PMOS transistor.

A second capacitive coupling part includes a third terminal and a fourth terminal, in which the third terminal is connected to a gate terminal of the first NMOS transistor, and the fourth terminal is connected to the gate terminal of the second NMOS transistor or the gate terminal of the second PMOS transistor, and the second capacitive coupling part controls capacitive coupling between the third and fourth terminals based on a potential at the gate terminal of the first NMOS transistor.

Patent Document 1: Japanese Laid-open Patent Publication No. 2014-209715

When a voltage higher than a withstand voltage of a transistor is applied to the transistor, the transistor may be destroyed.

SUMMARY

An output circuit includes: a first input transistor of a first conductivity type that is provided between a first power supply line having a first power supply potential and a first intermediate node, and has a gate to which a first input signal is configured to be supplied; a second input transistor of a second conductivity type that is provided between a second intermediate node and a second power supply line having a second power supply potential, and has a gate to which a second input signal having a logic same as that of the first input signal is configured to be supplied; a first cascode transistor that is provided between the first intermediate node and an output node, and has a gate to which a first clip voltage having an intermediate potential between the first power supply potential and the second power supply potential is configured to be supplied; a second cascode transistor that is provided between the output node and the second intermediate node, and has a gate to which a second clip voltage having an intermediate potential between the first power supply potential and the second power supply potential is configured to be supplied; a first switch transistor that is provided between the first intermediate node and the gate of the first cascode transistor, and is configured to turn on during power down; a second switch transistor that is provided between the second intermediate node and the gate of the second cascode transistor, and is configured turn on during power down; a first voltage generation circuit configured to generate the first clip voltage; and a second voltage generation circuit configured to generate the second clip voltage, in which the first switch transistor and the second switch transistor are electrically connected via the first voltage generation circuit and the second voltage generation circuit.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 6 is a circuit diagram illustrating another configuration example of the 1.65 V power supplies.

DESCRIPTION OF EMBODIMENTS

Figure 1:
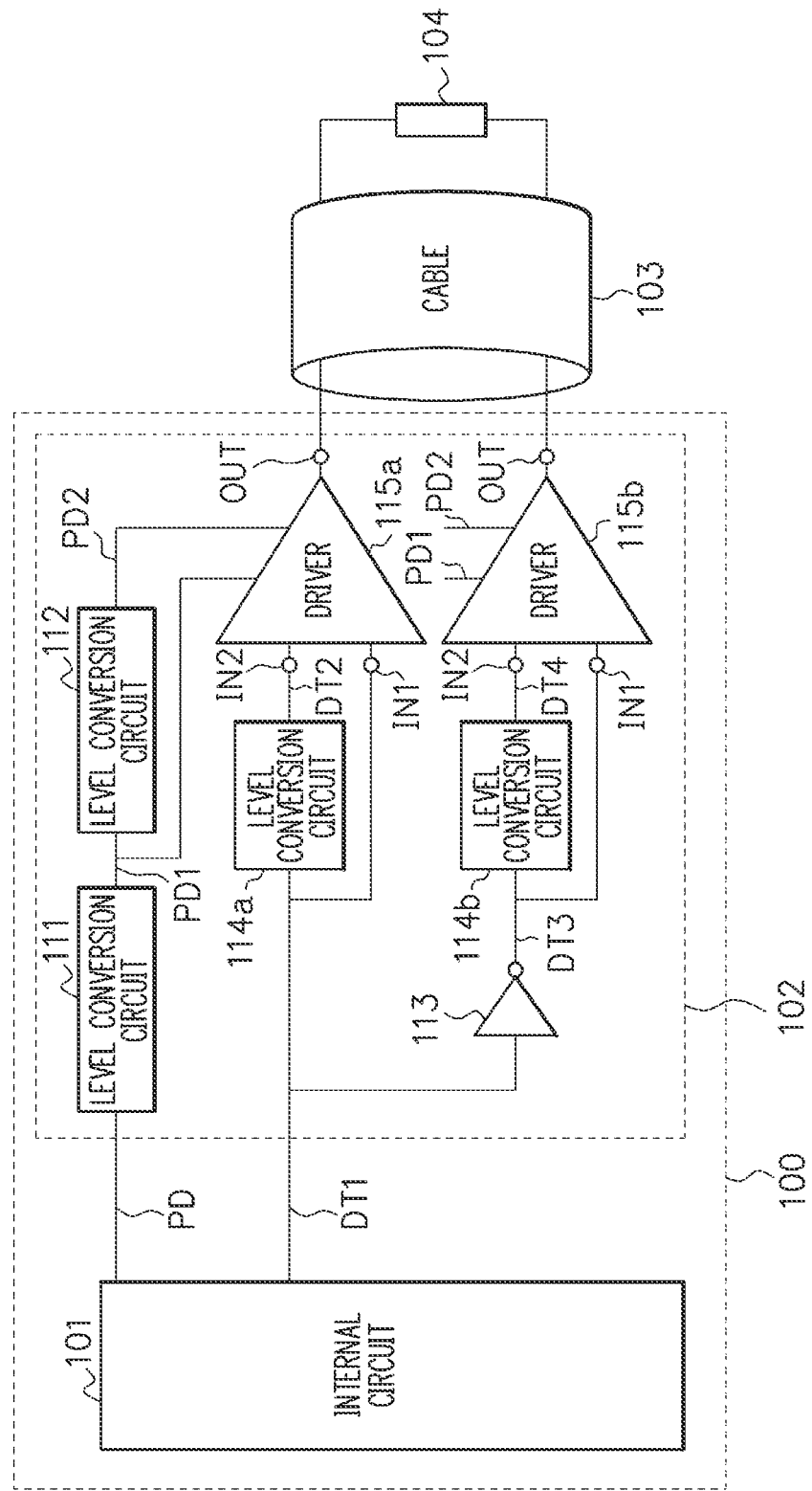
FIG. 1 is a view illustrating a configuration example of a semiconductor integrated circuit according to the present embodiment.

FIG. 1 is a view illustrating a configuration example of a semiconductor integrated circuit 100 according to the present embodiment. The semiconductor integrated circuit 100 includes an internal circuit 101, and a transmission circuit 102. The internal circuit 101 outputs an input signal DT1 for transmission, and a power-down signal PD indicating power down. The input signal DT1 is a binary signal of a voltage in a range of 0 V to 1.8 V, for example. The power-down signal PD is at a high level in a power-down mode, and is at a low level in a normal mode, for example. The transmission circuit 102 receives the input signal DT1 and the power-down signal PD.

The transmission circuit 102 includes a level conversion circuit 111, a level conversion circuit 112, an inverter 113, a level conversion circuit 114a, a level conversion circuit 114b, a driver 115a, and a driver 115b.

The level conversion circuit 111 performs logic inversion and level conversion on the power-down signal PD, and outputs a power-down signal PD1 to the drivers 115a and 115b. The power-down signal PD1 is a signal corresponding to the power-down signal PD whose logic is inverted and whose level is converted. The power-down signal PD is a binary signal of a voltage in a range of 0 V to 0.9 V, for example. The power-down signal PD1 is a binary signal of a voltage in a range of 0 V to 1.8 V, for example.

Figure 4:
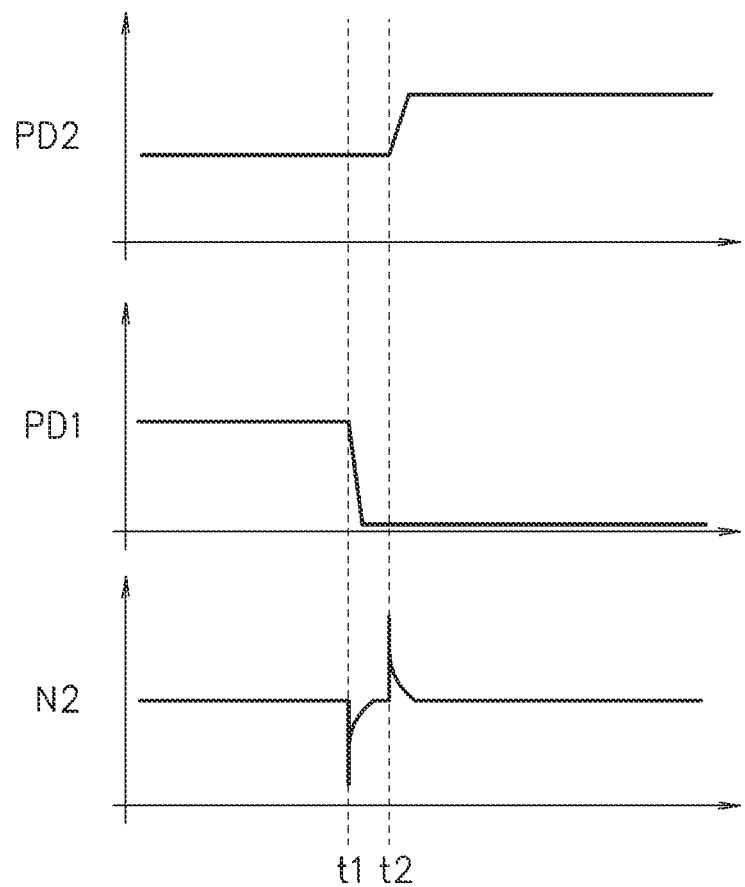
FIG. 4 is a timing chart illustrating voltages of power-down signals and a voltage at an intermediate node.

The level conversion circuit 112 performs logic inversion and level conversion on the power-down signal PD1, and outputs a power-down signal PD2 to the drivers 115a and 115b. As illustrated in FIG. 4, the power-down signal PD2 is a signal corresponding to the power-down signal PD1 whose logic is inverted and whose level is converted. By the level conversion circuit 112, the power-down signal PD2 becomes a signal which is slightly delayed with respect to the power-down signal PD1. A rising time t2 of the power-down signal PD2 is a time which is slightly delayed with respect to a falling time t1 of the power-down signal PD1. The power-down signal PD1 is a binary signal of a voltage in a range of 0 V to 1.8 V, for example. The power-down signal PD2 is a binary signal of a voltage in a range of 1.8 V to 3.3 V, for example. In the power-down mode, the power-down signal PD1 is at a low level, and the power-down signal PD2 is at a high level. In the normal mode, the power-down signal PD1 is at a high level, and the power-down signal PD2 is at a low level.

The level conversion circuit 114a receives the input signal DT1, and outputs an input signal DT2 obtained by performing level conversion on the input signal DT1 and having a logic same as that of the input signal DT1. The input signal DT1 is a binary signal of a voltage in a range of 0 V to 1.8 V, for example. The input signal DT2 is a binary signal of a voltage in a range of 1.8 V to 3.3 V, for example.

The driver 115a is an output circuit, and includes an input node IN1, an input node IN2, and an output node OUT. The input node IN1 of the driver 115a receives the input signal DT1. The input node IN2 of the driver 115a receives the input signal DT2. The output node OUT of the driver 115a outputs an output signal whose logic is inverted with respect to that of the input signals DT1 and DT2. Details of the driver 115a will be described later while referring to FIG. 2.

The inverter 113 receives the input signal DT1, and outputs an input signal DT3 obtained by performing logic inversion on the input signal DT1. The level conversion circuit 114b receives the input signal DT3, and outputs an input signal DT4 obtained by performing level conversion on the input signal DT3 and having a logic same as that of the input signal DT3. The input signal DT3 is a binary signal of a voltage in a range of 0 V to 1.8 V, for example. The input signal DT4 is a binary signal of a voltage in a range of 1.8 V to 3.3 V, for example.

The driver 115b is an output circuit, and includes an input node IN1, an input node IN2, and an output node OUT. The input node IN1 of the driver 115b receives the input signal DT3. The input node IN2 of the driver 115b receives the input signal DT4. The output node OUT of the driver 115b outputs an output signal whose logic is inverted with respect to that of the input signals DT3 and DT4. The output signal at the output node OUT of the driver 115a and the output signal at the output node OUT of the driver 115b are differential signals whose phases are mutually inverted. The configuration of the driver 115b is the same as the configuration of the driver 115a.

The output node OUT of the driver 115a and the output node OUT of the driver 115b are connected to both ends of a terminating resistor 104 via a cable 103. The transmission circuit 102 transmits the differential signals via the cable 103. Note that the transmission circuit 102 may also transmit a single-ended signal, instead of the differential signals.

Figure 2:
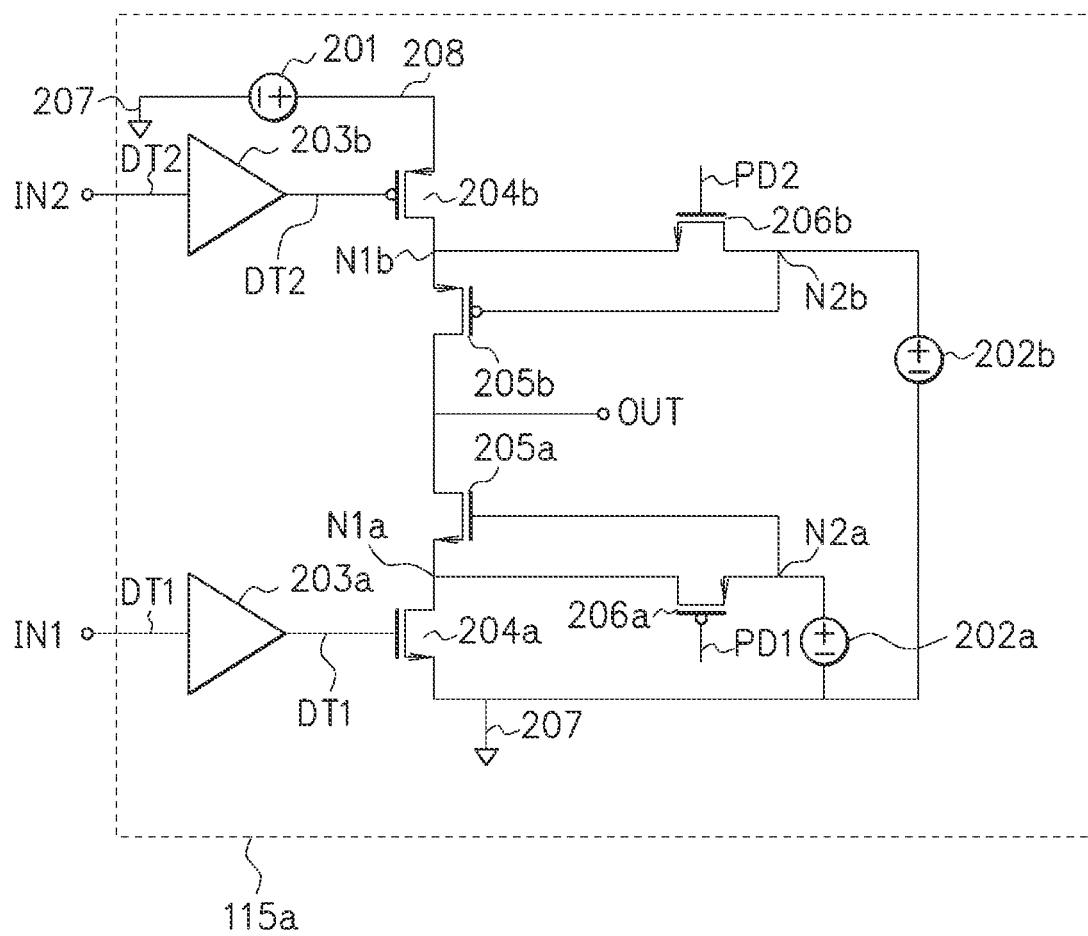
FIG. 2 is a circuit diagram illustrating a configuration example of a driver according to the present embodiment.

FIG. 2 is a circuit diagram illustrating a configuration example of the driver 115a according to the present embodiment. Although the driver 115b also has a configuration same as that of the driver 115a, explanation will be made by citing the configuration of the driver 115a as an example.

The driver 115a includes a 3.3 V power supply 201, 1.65 V power supplies 202a, 202b, buffers 203a, 203b, n-channel field effect transistors 204a, 205a, 206b, and p-channel field effect transistors 204b, 205b, 206a.

The n-channel field effect transistors 204a, 205a, and 206b are field effect transistors of a conductivity type different from that of the p-channel field effect transistors 204b, 205b, and 206a. For example, a withstand voltage of each of the n-channel field effect transistors 204a, 205a, 206b, and the p-channel field effect transistors 204b, 205b, 206a is 1.8 V.

Therefore, when a voltage higher than 1.8 V is applied to each of the n-channel field effect transistors 204a, 205a, 206b, and the p-channel field effect transistors 204b, 205b, 206a, the n-channel field effect transistors 204a, 205a, 206b, and the p-channel field effect transistors 204b, 205b, 206a may be destroyed.

By setting that the voltage higher than 1.8 V is not applied to each of the n-channel field effect transistors 204a, 205a, 206b, and the p-channel field effect transistors 204b, 205b, 206a, the n-channel field effect transistors 204a, 205a, 206b, and the p-channel field effect transistors 204b, 205b, 206a are prevented from being destroyed.

The 3.3 V power supply 201 is connected between a reference potential line 207 and a 3.3 V line 208, and supplies 3.3 V to the 3.3 V line 208. The 3.3 V line is a power supply line having a power supply potential of 3.3 V. The reference potential line 207 is a power supply line having a reference potential. The reference potential is, for example, a ground potential (power supply potential of 0 V). The reference potential is lower than 3.3 V.

The 1.65 V power supply 202a, being a voltage generation circuit, is connected between the reference potential line 207 and an intermediate node N2a, and it generates a clip voltage of 1.65 V and supplies the clip voltage of 1.65 V to the intermediate node N2a.

The 1.65 V power supply 202b, being a voltage generation circuit, is connected between the reference potential line 207 and an intermediate node N2b, and it generates a clip voltage of 1.65 V and supplies the clip voltage of 1.65 V to the intermediate node N2b.

The clip voltage of 1.65 V supplied by the 1.65 V power supply 202b is a voltage same as the clip voltage of 1.65 V supplied by the 1.65 V power supply 202a. The clip voltage of 1.65 V has an intermediate potential between 3.3 V of the 3.3 V line 208 and 0 V of the reference potential line 207.

The p-channel field effect transistor 204b is an input transistor, and has a source connected to the 3.3 V line 208, a gate connected to the input node IN2 via the buffer 203b, and a drain connected to an intermediate node N1b. To the gate of the p-channel field effect transistor 204b, the input signal DT2 is supplied via the buffer 203b. The buffer 203b supplies the input signal DT2 in a range of 1.8 V to 3.3 V to the gate of the p-channel field effect transistor 204b.

The n-channel field effect transistor 204a is an input transistor, and has a source connected to the reference potential line 207, a gate connected to the input node IN1 via the buffer 203a, and a drain connected to an intermediate node N1a. To the gate of the n-channel field effect transistor 204a, the input signal DT1 is supplied via the buffer 203a.

The buffer 203a supplies the input signal DT1 in a range of 0 V to 1.8 V to the gate of the n-channel field effect transistor 204a.

The input signal DT1 is a voltage in a range of 0 V to 1.8 V. The input signal DT2 is a voltage in a range of 1.8 V to 3.3 V. With respect to the input signal DT1, the input signal DT2 is a voltage in a higher range and in a different range, and has the same logic. Specifically, when the input signal DT1 is at a high level (1.8 V), the input signal DT2 is also at a high level (3.3 V). When the input signal DT1 is at a low level (0 V), the input signal DT2 is also at a low level (1.8 V).

The p-channel field effect transistor 205b is a cascode transistor, and has a source connected to the intermediate node N1b, a gate connected to the intermediate node N2b, and a drain connected to the output node OUT. The 1.65 V power supply 202b supplies the clip voltage of 1.65 V to the gate of the p-channel field effect transistor 205b.

The n-channel field effect transistor 205a is a cascode transistor, and has a source connected to the intermediate node N1a, a gate connected to the intermediate node N2a, and a drain connected to the output node OUT. The 1.65 V power supply 202a supplies the clip voltage of 1.65 V to the gate of the n-channel field effect transistor 205a.

The n-channel field effect transistor 206b is a switch transistor, and has a source connected to the intermediate node N1b, and a drain connected to the intermediate node N2b. A gate of the n-channel field effect transistor 206b receives the power-down signal PD2. As illustrated in FIG. 4, the power-down signal PD2 is a binary signal of a voltage in a range of 1.8 V to 3.3 V. The power-down signal PD2 becomes a high level (3.3 V) in the power-down mode, and becomes a low level (1.8 V) in the normal mode.

The p-channel field effect transistor 206a is a switch transistor, and has a source connected to the intermediate node N2a, and a drain connected to the intermediate node N1a. A gate of the p-channel field effect transistor 206a receives the power-down signal PD1. As illustrated in FIG. 4, the power-down signal PD1 is a binary signal of a voltage in a range of 0 V to 1.8 V. The power-down signal PD1 becomes a low level (0 V) in the power-down mode, and becomes a high level (1.8 V) in the normal mode.

The drain of the n-channel field effect transistor 206b and the source of the p-channel field effect transistor 206a are electrically connected via the 1.65 V power supply 202b and the 1.65 V power supply 202a.

First, an operation of the normal mode will be described. In the normal mode, the power-down signal PD1 becomes a high level, and the power-down signal PD2 becomes a low level. The p-channel field effect transistor 206a and the n-channel field effect transistor 206b are turned into an off state.

The gate of the p-channel field effect transistor 204b receives the input signal DT2. The gate of the n-channel field effect transistor 204a receives the input signal DT1.

When the input signal DT1 is at a low level, the input signal DT2 is also at a low level. The p-channel field effect transistor 204b is turned into an on state, and the n-channel field effect transistor 204a is turned into an off state. Accordingly, the voltage at the output node OUT becomes a high level.

When the input signal DT1 is at a high level, the input signal DT2 is also at a high level. The p-channel field effect transistor 204b is turned into an off state, and the n-channel field effect transistor 204a is turned into an on state. Accordingly, the voltage at the output node OUT becomes a low level.

As described above, the driver 115a outputs the signal as a result of inverting the logic of the input signals DT1 and DT2, from the output terminal OUT.

Next, an operation of the power-down mode will be described. In the power-down mode, the power-down signal PD1 becomes a low level, and the power-down signal PD2 becomes a high level. The p-channel field effect transistor 206a and the n-channel field effect transistor 206b are turned into an on state.

The internal circuit 101 fixes the gate voltage of the p-channel field effect transistor 204b to a high level, and fixes the gate voltage of the n-channel field effect transistor 204a to a low level. The p-channel field effect transistor 204b and the n-channel field effect transistor 204a are turned into an off state. This prevents a current from flowing, and thus power consumption can be reduced in the power-down mode.

The 1.65 V power supply 202b applies 1.65 V to the intermediate node N1b via the n-channel field effect transistor 206b. Accordingly, it is possible to prevent a voltage higher than 1.8 V from being applied to each of the p-channel field effect transistors 204b and 205b, resulting in that the p-channel field effect transistors 204b and 205b can be prevented from being destroyed.

The 1.65 V power supply 202a applies 1.65 V to the intermediate node N1a via the p-channel field effect transistor 206a. Accordingly, it is possible to prevent a voltage higher than 1.8 V from being applied to each of the n-channel field effect transistors 204a and 205a, resulting in that the n-channel field effect transistors 204a and 205a can be prevented from being destroyed.

The driver 115a includes the two 1.65 V power supplies 202a and 202b. Consequently, when the normal mode is switched to the power-down mode, it is possible to prevent a spike noise higher than 1.8 V from being applied to each of the p-channel field effect transistors 204b, 205b, and the n-channel field effect transistors 204a, 205a. In order to explain this effect, a problem in a case where the driver 115a includes one 1.65 V power supply 202, will be described while referring to FIG. 3 and FIG. 4.

Figure 3:
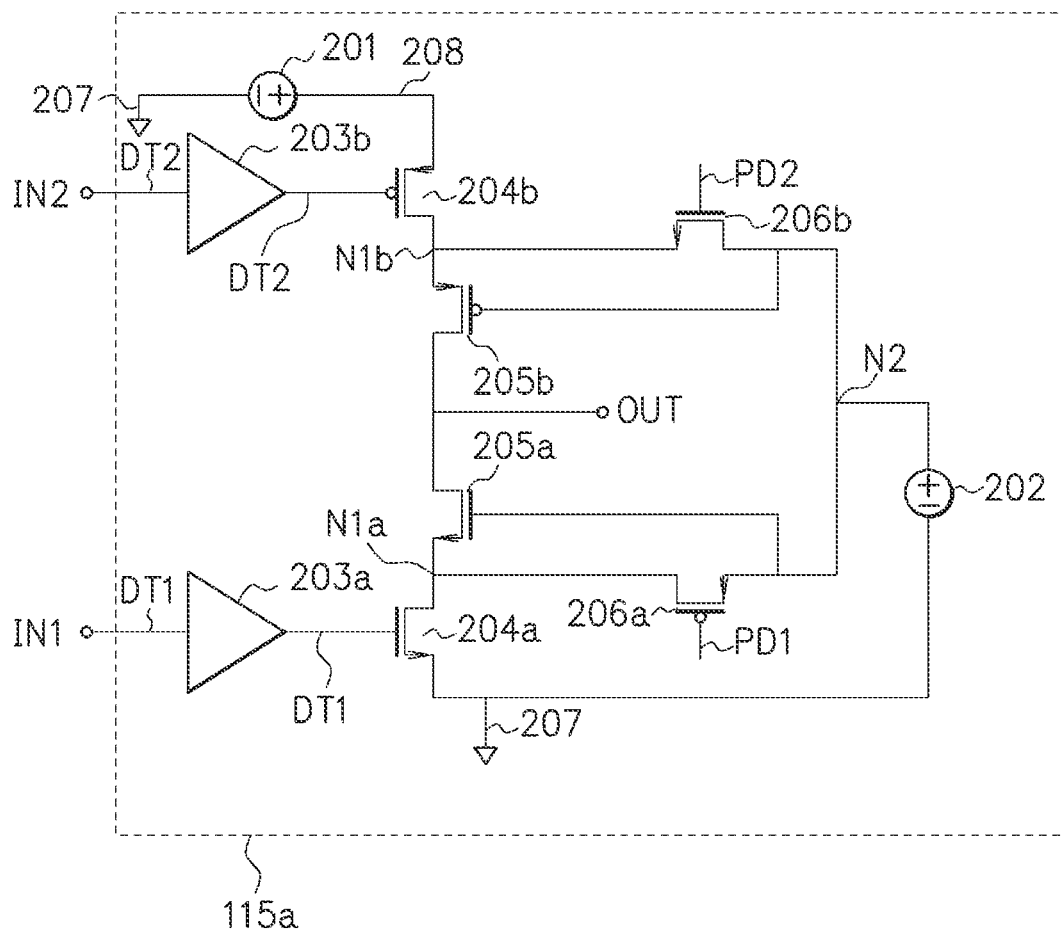
FIG. 3 is a circuit diagram illustrating a configuration example of a driver having one 1.65 V power supply.

FIG. 3 is a circuit diagram illustrating a configuration example of the driver 115a including one 1.65 V power supply 202. The driver 115a in FIG. 3 corresponds to the driver 115a in FIG. 2 which is provided with one 1.65 V power supply 202, instead of the two 1.65 V power supplies 202a and 202b.

The 1.65 V power supply 202 supplies 1.65 V to an intermediate node N2. The drain of the n-channel field effect transistor 206b and the gate of the p-channel field effect transistor 205b are connected to the intermediate node N2. The source of the p-channel field effect transistor 206a and the gate of the n-channel field effect transistor 205a are connected to the intermediate node N2.

FIG. 4 is a timing chart illustrating the voltages of the power-down signals PD1, PD2, and the voltage at the intermediate node N2. A mode before a time t1 is the normal mode, in which the power-down signal PD1 is at a high level, and the power-down signal PD2 is at a low level. The p-channel field effect transistor 206a and the n-channel field effect transistor 206b are turned into an off state. The 1.65 V power supply 202 applies 1.65 V to the intermediate node N2.

When the normal mode is switched to the power-down mode, at the time t1, the power-down signal PD1 shifts from a high level to a low level, and at a time t2, the power-down signal PD2 shifts from a low level to a high level. A mode at the time t2 and thereafter is the power-down mode.

It is difficult to make the falling time t1 of the power-down signal PD1 and the rising time t2 of the power-down signal PD2 coincide with each other. As illustrated in FIG. 1, the level conversion circuit 112 generates the power-down signal PD2 based on the power-down signal PD1. Accordingly, the rising time t2 of the power-down signal PD2 is slightly delayed with respect to the falling time t1 of the power-down signal PD1.

At the time t1, the p-channel field effect transistor 206a changes from an off state to an on state. For example, the intermediate node N1a has 0.3 V, and the intermediate node N1b has 2.8 V. The intermediate node N1a has 0.3 V, so that when the p-channel field effect transistor 206a is turned into an on state, a spike noise of 0.3 V is generated at the intermediate node N2.

To the drain of the n-channel field effect transistor 206b, the spike noise of 0.3 V at the intermediate node N2 is applied. To the source of the n-channel field effect transistor 206b, 2.8 V at the intermediate node N1b is applied. Accordingly, 2.5 V (=2.8 V−0.3 V) which is higher than 1.8 V, is applied between the source and the drain of the n-channel field effect transistor 206b. Consequently, there arises a problem that the n-channel field effect transistor 206b is highly likely to be destroyed.

Further, to the gate of the p-channel field effect transistor 205b, the spike noise of 0.3 V at the intermediate node N2 is applied. To the source of the p-channel field effect transistor 205b, 2.8 V at the intermediate node N1b is applied. Accordingly, 2.5 V (=2.8 V−0.3 V) which is higher than 1.8 V, is applied between the source and the gate of the p-channel field effect transistor 205b. Consequently, there arises a problem that the p-channel field effect transistor 205b is highly likely to be destroyed.

At the time t2, the n-channel field effect transistor 206b changes from an off state to an on state. The p-channel field effect transistor 206a and the n-channel field effect transistor 206b change from an off state to an on state at mutually different timings during power down. For example, the intermediate node N1a has 0.3 V, and the intermediate node N1b has 2.8 V. The intermediate node N1b has 2.8 V, so that when the n-channel field effect transistor 206b is turned into an on state, a spike noise of 2.8 V is generated at the intermediate node N2.

To the source of the p-channel field effect transistor 206a, the spike noise of 2.8 V at the intermediate node N2 is applied. To the drain of the p-channel field effect transistor 206a, 0.3 V at the intermediate node N1a is applied. Accordingly, 2.5 V (=2.8 V−0.3 V) which is higher than 1.8 V, is applied between the source and the drain of the p-channel field effect transistor 206a. Consequently, there arises a problem that the p-channel field effect transistor 206a is highly likely to be destroyed.

Further, to the gate of the n-channel field effect transistor 205a, the spike noise of 2.8 V at the intermediate node N2 is applied. To the source of the n-channel field effect transistor 205a, 0.3 V at the intermediate node N1a is applied. Accordingly, 2.5 V (=2.8 V−0.3 V) which is higher than 1.8 V, is applied between the source and the gate of the n-channel field effect transistor 205a. Consequently, there arises a problem that the n-channel field effect transistor 205a is highly likely to be destroyed.

The driver 105a in FIG. 2 can solve the problems caused by the spike noise described above. Hereinafter, an effect provided when the driver 105a in FIG. 2 includes the two 1.65 V power supplies 202a and 202b, will be described.

At the time t1, the spike noise of 0.3 V is generated at the intermediate node N2a. However, the intermediate node N2a is not directly connected to the intermediate node N2b, and is connected to the intermediate node N2b via the 1.65 V power supplies 202a and 202b. For this reason, it is possible to prevent the spike noise of 0.3 V at the intermediate node N2a from being propagated to the intermediate node N2b.

The 1.65 V power supply 202b supplies 1.65 V to the intermediate node N2b. Accordingly, a voltage lower than 1.8 V is applied between the source and the drain of the n-channel field effect transistor 206b. In like manner, a voltage lower than 1.8 V is applied between the source and the gate of the p-channel field effect transistor 205b. Consequently, it is possible to prevent the n-channel field effect transistor 206b and the p-channel field effect transistor 205b from being destroyed.

At the time t2, the spike noise of 2.8 V is generated at the intermediate node N2b. However, the intermediate node N2b is not directly connected to the intermediate node N2a, and is connected to the intermediate node N2a via the 1.65 V power supplies 202b and 202a. For this reason, it is possible to prevent the spike noise of 2.8 V at the intermediate node N2b from being propagated to the intermediate node N2a.

The 1.65 V power supply 202a supplies 1.65 V to the intermediate node N2a. Accordingly, a voltage lower than 1.8 V is applied between the source and the drain of the p-channel field effect transistor 206a. In like manner, a voltage lower than 1.8 V is applied between the source and the gate of the n-channel field effect transistor 205a. Consequently, it is possible to prevent the p-channel field effect transistor 206a and the n-channel field effect transistor 205a from being destroyed.

Figure 5:
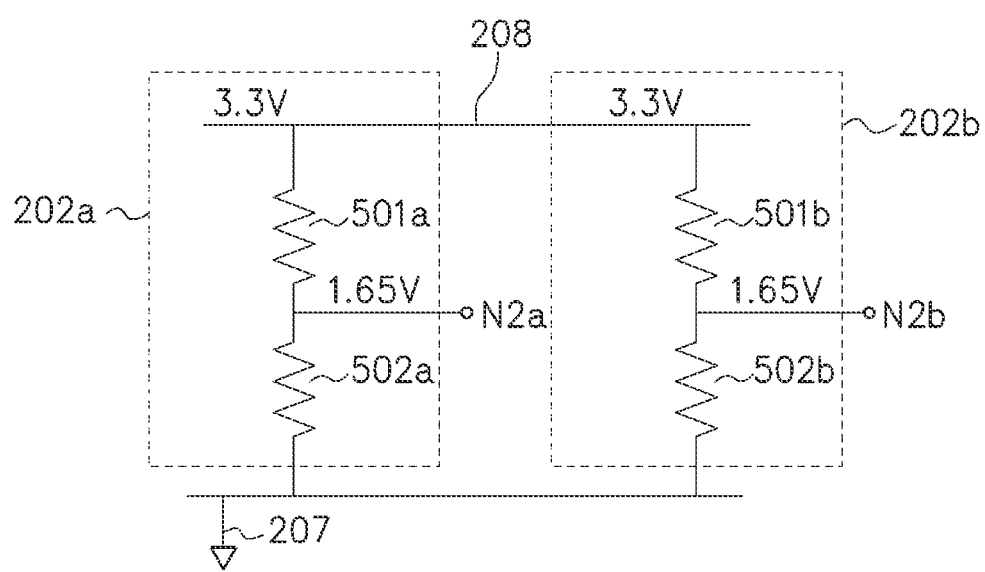
FIG. 5 is a circuit diagram illustrating a configuration example of 1.65 V power supplies.

FIG. 5 is a circuit diagram illustrating a configuration example of the 1.65 V power supplies 202a and 202b in FIG. 2. The 1.65 V power supply 202a includes a resistor 501a and a resistor 502a, and supplies a clip voltage of 1.65 V to the intermediate node N2a. The resistor 501a is connected between the 3.3 V line 208 and the intermediate node N2a. The resistor 502a is connected between the intermediate node N2a and the reference potential line 207. Since the resistors 501a and 502a divide the voltage of 3.3 V, 1.65 V being an intermediate potential of 3.3 V and 0 V is supplied to the intermediate node N2a.

The 1.65 V power supply 202b includes a resistor 501b and a resistor 502b, and supplies 1.65 V to the intermediate node N2b. The resistor 501b is connected between the 3.3 V line 208 and the intermediate node N2b. The resistor 502b is connected between the intermediate node N2b and the reference potential line 207. Since the resistors 501b and 502b divide the voltage of 3.3 V, 1.65 V being an intermediate potential of 3.3 V and 0 V is supplied to the intermediate node N2b.

Specifically, in a case of the circuit illustrated in FIG. 5, the drain of the n-channel field effect transistor 206b and the source of the p-channel field effect transistor 206a are electrically connected via the resistor 501a, the 3.3 V line 208, and the resistor 501b, and are electrically connected via the resistor 502a, the reference potential line 207, and the resistor 502b. The clip voltages supplied to the intermediate node N2a and the intermediate node N2b are voltages generated in a mutually independent manner by the 1.65 V power supplies 202a and 202b.

Consequently, even if a spike noise is generated at one of the intermediate nodes N2a and N2b, the spike noise can be prevented from being propagated to the other of the intermediate nodes N2a and N2b.

Note that in FIG. 5, it is configured that both of the resistor 501a of the 1.65 V power supply 202a and the resistor 501b of the 1.65 V power supply 202b are connected to the 3.3 V line 208, but they do not have to be connected to the common power supply line, and as a modified example, it is also possible to configure such that the 1.65 V power supplies 202a and 202b connect one or both of the resistor 501a and the resistor 501b to a power supply line different from the 3.3 V line 208, with a power supply potential different from that of the 3.3 V line 206.

Also in a case of the circuit of this modified example, the drain of the n-channel field effect transistor 206b and the source of the p-channel field effect transistor 206a are electrically connected via the resistor 502a, the reference potential line 207, and the resistor 502b, in a similar manner. The clip voltages supplied to the intermediate node N2a and the intermediate node N2b are voltages generated in a mutually independent manner by the 1.65 V power supplies 202a and 202b.

Consequently, even if a spike noise is generated at one of the intermediate nodes N2a and N2b, the spike noise can be prevented from being propagated to the other of the intermediate nodes N2a and N2b.

FIG. 6 is a circuit diagram illustrating another configuration example of the 1.65 V power supplies 202a and 202b in FIG. 2. The 1.65 V power supplies 202a and 202b share a resistor 601 and a resistor 602. The resistor 601 is connected between the 3.3 V line 208 and an intermediate node N3. The resistor 602 is connected between the intermediate node N3 and the reference potential line 207. Since the resistors 601 and 602 divide the voltage of 3.3 V, 1.65 V being an intermediate potential of 3.3 V and 0 V is supplied to the intermediate node N3.

The 1.65 V power supply 202a further includes a high-resistance resistor 603a. The high-resistance resistor 603a is connected between the intermediate node N3 and the intermediate node N2a. The 1.65 V power supply 202b further includes a high-resistance resistor 603b. The high-resistance resistor 603b is connected between the intermediate node N3 and the intermediate node N2b. Here, each of resistance values of the high-resistance resistors 603a and 603b is sufficiently larger than the resistance values of the resistor 601 and the resistor 602. The resistance value of each of the high-resistance resistors 603a and 603b may be set according to the withstand voltage of each transistor and the voltage of the spike noise, and it may be one which is larger by about five times than the resistance values of the resistor 601 and the resistor 602, in the case of the circuit illustrated in FIG. 2, for example. The 1.65 V power supply 202a supplies a clip voltage of 1.65 V to the intermediate node N2a. The 1.65 V power supply 202b supplies a clip voltage of 1.65 V to the intermediate node N2b.

Specifically, in a case of the circuit illustrated in FIG. 6, the drain of the n-channel field effect transistor 206b and the source of the p-channel field effect transistor 206a are electrically connected via the high-resistance resistor 603a, the node N3 to which the divided voltage of 1.65 V is supplied, and the high-resistance resistor 603b.

Consequently, even if a spike noise is generated at one of the intermediate nodes N2a and N2b, the spike noise can be prevented from being propagated to the other of the intermediate nodes N2a and N2b.

Note that in FIG. 6, it is configured that the resistor 601 of the 1.65 V power supplies 202a and 202b is connected to the 3.3 V line 208, but not limited to this, and as a modified example, it is also possible to configure such that the resistor 601 of the 1.65 V power supplies 202a and 202b is connected to a power supply line different from the 3.3 V line 208, with a power supply potential different from that of the 3.3 V line 208.

Also in a case of the circuit of this modified example, the drain of the n-channel field effect transistor 206b and the source of the p-channel field effect transistor 206a are electrically connected via the high-resistance resistor 603a, the node N3 to which the divided voltage of 1.65 V is supplied, and the high-resistance resistor 603b, in a similar manner.

Consequently, even if a spike noise is generated at one of the intermediate nodes N2a and N2b, the spike noise can be prevented from being propagated to the other of the intermediate nodes N2a and N2b.

As described above, each of the drivers 115a and 115b includes the two 1.65 V power supplies 202a and 202b. Accordingly, when the power-down mode is started, it is possible to prevent a voltage higher than the withstand voltage of each of the field effect transistors 205a, 205b, 206a, 206b from being applied to each of the field effect transistors 205a, 205b, 206a, 206b.

Note that the above-described embodiments merely illustrate concrete examples of implementing the present embodiments, and the technical scope of the present embodiments is not to be construed in a restrictive manner by these embodiments. That is, the present embodiments may be implemented in various forms without departing from the technical spirit or main features thereof.

When power down is started, it is possible to prevent a voltage higher than a withstand voltage of a transistor from being applied to the transistor.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An output circuit, comprising:
   a first input transistor of a first conductivity type that is provided between a first power supply line having a first power supply potential and a first intermediate node, and has a gate to which a first input signal is configured to be supplied;
   a second input transistor of a second conductivity type that is provided between a second intermediate node and a second power supply line having a second power supply potential, and has a gate to which a second input signal having a logic same as that of the first input signal is configured to be supplied;
   a first cascode transistor that is provided between the first intermediate node and an output node, and has a gate to which a first clip voltage having an intermediate potential between the first power supply potential and the second power supply potential is configured to be supplied;
   a second cascode transistor that is provided between the output node and the second intermediate node, and has a gate to which a second clip voltage having an intermediate potential between the first power supply potential and the second power supply potential is configured to be supplied;
a first switch transistor that is provided between the first intermediate node and the gate of the first cascode transistor, and is configured to turn on during power down;
a second switch transistor that is provided between the second intermediate node and the gate of the second cascode transistor, and is configured to turn on during power down;
a first voltage generation circuit configured to generate the first clip voltage; and
a second voltage generation circuit configured to generate the second clip voltage, wherein
the first switch transistor and the second switch transistor are electrically connected via the first voltage generation circuit and the second voltage generation circuit.

2. The output circuit according to claim 1, wherein:
the first voltage generation circuit includes:
a first resistor that is provided between the first power supply line and the gate of the first cascode transistor; and
a second resistor that is provided between the second power supply line and the gate of the first cascode transistor;
the second voltage generation circuit includes:
a third resistor that is provided between the first power supply line and the gate of the second cascode transistor; and
a fourth resistor that is provided between the second power supply line and the gate of the second cascode transistor; and
the first switch transistor and the second switch transistor are electrically connected via the first resistor, the first power supply line, and the third resistor, and are electrically connected via the second resistor, the second power supply line, and the fourth resistor.

3. The output circuit according to claim 1, wherein:
the first voltage generation circuit includes:
a first resistor that is provided between a third power supply line having a third power supply potential and the gate of the first cascode transistor; and
a second resistor that is provided between the second power supply line and the gate of the first cascode transistor;
the second voltage generation circuit includes:
a third resistor that is provided between a fourth power supply line having a fourth power supply potential and the gate of the second cascode transistor; and
a fourth resistor that is provided between the second power supply line and the gate of the second cascode transistor; and
the first switch transistor and the second switch transistor are electrically connected via the second resistor, the second power supply line, and the fourth resistor.

4. The output circuit according to claim 1, wherein:
the first voltage generation circuit and the second voltage generation circuit share:
a first resistor that is provided between a fifth power supply line having a fifth power supply potential and a third intermediate node; and
a second resistor that is provided between the second power supply line and the third intermediate node;
the first voltage generation circuit includes a third resistor that is provided between the third intermediate node and the gate of the first cascode transistor, and has a resistance value larger than that of the first resistor and the second resistor;
the second voltage generation circuit includes a fourth resistor that is provided between the third intermediate node and the gate of the second cascode transistor, and has a resistance value larger than that of the first resistor and the second resistor; and
the first switch transistor and the second switch transistor are electrically connected via the third resistor, the third intermediate node, and the fourth resistor.

5. The output circuit according to claim 4, wherein
the fifth power supply potential is equal to the first power supply potential.

6. The output circuit according to claim 1, wherein
the first clip voltage and the second clip voltage are voltages generated in a mutually independent manner by the first voltage generation circuit and the second voltage generation circuit.

7. The output circuit according to claim 1, wherein:
the first cascode transistor is a transistor of the first conductivity type; and
the second cascode transistor is a transistor of the second conductivity type.

8. The output circuit according to claim 1, wherein:
the first switch transistor is a transistor of the second conductivity type; and
the second switch transistor is a transistor of the first conductivity type.

9. The output circuit according to claim 1, wherein:
the first input transistor is a p-channel field effect transistor;
the second input transistor is an n-channel field effect transistor;
the first cascode transistor is a p-channel field effect transistor;
the second cascode transistor is an n-channel field effect transistor;
the first switch transistor is an n-channel field effect transistor; and
the second switch transistor is a p-channel field effect transistor.

10. The output circuit according to claim 1, wherein:
the first input transistor has a source connected to the first power supply line, and a drain connected to the first intermediate node;
the second input transistor has a source connected to the second power supply line, and a drain connected to the second intermediate node;
the first cascode transistor has a source connected to the first intermediate node, and a drain connected to the output node;
the second cascode transistor has a source connected to the second intermediate node, and a drain connected to the output node;
the first switch transistor has a source connected to the first intermediate node, and a drain connected to the gate of the first cascode transistor; and
the second switch transistor has a source connected to the gate of the second cascode transistor, and a drain connected to the second intermediate node.

11. The output circuit according to claim 1, wherein:
the first input signal is a voltage in a first range; and
the second input signal is a voltage in a second range which is different from the first range.

12. The output circuit according to claim 11, wherein:
the gate of the first switch transistor is configured to receive a first power-down signal of a voltage in the first range; and
the gate of the second switch transistor is configured to receive a second power-down signal of a voltage in the second range.

13. The output circuit according to claim 11, wherein the voltage in the second range is lower than the voltage in the first range.

14. The output circuit according to claim 1, wherein the first switch transistor and the second switch transistor change from off to on at mutually different timings, during power down.

15. A transmission circuit, comprising:
a level conversion circuit configured to output a first input signal obtained by performing level conversion on a second input signal, the first input signal having a logic same as that of the second input signal; and
an output circuit configured to receive the first input signal and the second input signal, wherein
the output circuit includes:
a first input transistor of a first conductivity type that is provided between a first power supply line having a first power supply potential and a first intermediate node, and has a gate to which the first input signal is configured to be supplied;
a second input transistor of a second conductivity type that is provided between a second intermediate node and a second power supply line having a second power supply potential, and has a gate to which the second input signal is configured to be supplied;
a first cascode transistor that is provided between the first intermediate node and an output node, and has a gate to which a first clip voltage having an intermediate potential between the first power supply potential and the second power supply potential is configured to be supplied;
a second cascode transistor that is provided between the output node and the second intermediate node, and has a gate to which a second clip voltage having an intermediate potential between the first power supply potential and the second power supply potential is configured to be supplied;
a first switch transistor that is provided between the first intermediate node and the gate of the first cascode transistor, and is configured to turn on during power down;
a second switch transistor that is provided between the second intermediate node and the gate of the second cascode transistor, and is configured to turn on during power down;
a first voltage generation circuit configured to generate the first clip voltage; and
a second voltage generation circuit configured to generate the second clip voltage, wherein
the first switch transistor and the second switch transistor are electrically connected via the first voltage generation circuit and the second voltage generation circuit.

16. The transmission circuit according to claim 15, wherein:
the first voltage generation circuit includes:
a first resistor that is provided between the first power supply line and the gate of the first cascode transistor; and
a second resistor that is provided between the second power supply line and the gate of the first cascode transistor;
the second voltage generation circuit includes:
a third resistor that is provided between the first power supply line and the gate of the second cascode transistor; and
a fourth resistor that is provided between the second power supply line and the gate of the second cascode transistor; and
the first switch transistor and the second switch transistor are electrically connected via the first resistor, the first power supply line, and the third resistor, and are electrically connected via the second resistor, the second power supply line, and the fourth resistor.

17. The transmission circuit according to claim 15, wherein:
the first voltage generation circuit includes:
a first resistor that is provided between a third power supply line having a third power supply potential and the gate of the first cascode transistor; and
a second resistor that is provided between the second power supply line and the gate of the first cascode transistor;
the second voltage generation circuit includes:
a third resistor that is provided between a fourth power supply line having a fourth power supply potential and the gate of the second cascode transistor; and
a fourth resistor that is provided between the second power supply line and the gate of the second cascode transistor; and
the first switch transistor and the second switch transistor are electrically connected via the second resistor, the second power supply line, and the fourth resistor.

18. The transmission circuit according to claim 15, wherein:
the first voltage generation circuit and the second voltage generation circuit share:
a first resistor that is provided between a fifth power supply line having a fifth power supply potential and a third intermediate node; and
a second resistor that is provided between the second power supply line and the third intermediate node;
the first voltage generation circuit includes a third resistor that is provided between the third intermediate node and the gate of the first cascode transistor, and has a resistance value larger than that of the first resistor and the second resistor;
the second voltage generation circuit includes a fourth resistor that is provided between the third intermediate node and the gate of the second cascode transistor, and has a resistance value larger than that of the first resistor and the second resistor; and
the first switch transistor and the second switch transistor are electrically connected via the third resistor, the third intermediate node, and the fourth resistor.

19. The transmission circuit according to claim 15, wherein:
the first input signal is a voltage in a first range; and
the second input signal is a voltage in a second range which is different from the first range.

20. A semiconductor integrated circuit, comprising:
an internal circuit configured to output a second input signal; and
a transmission circuit configured to receive the second input signal, wherein the transmission circuit includes:

a level conversion circuit configured to output a first input signal obtained by performing level conversion on the second input signal, the first input signal having a logic same as that of the second input signal; and an output circuit configured to receive the first input signal and the second input signal, wherein the output circuit includes:

a first input transistor of a first conductivity type that is provided between a first power supply line having a first power supply potential and a first intermediate node, and has a gate to which the first input signal is configured to be supplied;

a second input transistor of a second conductivity type that is provided between a second intermediate node and a second power supply line having a second power supply potential, and has a gate to which the second input signal is configured to be supplied;

a first cascode transistor that is provided between the first intermediate node and an output node, and has a gate to which a first clip voltage having an intermediate potential between the first power supply potential and the second power supply potential is configured to be supplied;

a second cascode transistor that is provided between the output node and the second intermediate node, and has a gate to which a second clip voltage having an intermediate potential between the first power supply potential and the second power supply potential is configured to be supplied;

a first switch transistor that is provided between the first intermediate node and the gate of the first cascode transistor, and is configured to turn on during power down;

a second switch transistor that is provided between the second intermediate node and the gate of the second cascode transistor, and is configured to turn on during power down;

a first voltage generation circuit that generates the first clip voltage; and a second voltage generation circuit that generates the second clip voltage, wherein the first switch transistor and the second switch transistor are electrically connected via the first voltage generation circuit and the second voltage generation circuit.

* * * * *